(12) United States Patent
Lee et al.

(10) Patent No.: US 7,755,457 B2
(45) Date of Patent: Jul. 13, 2010

(54) STACKED STRIPLINE CIRCUITS

(75) Inventors: Myung Ku Lee, Penfield, NY (US); Anthony Clement Manicone, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 375 days.

(21) Appl. No.: 11/348,658

(22) Filed: Feb. 7, 2006

(65) Prior Publication Data
US 2007/0182512 A1 Aug. 9, 2007

(51) Int. Cl.
*H01P 1/203* (2006.01)
*H01P 3/08* (2006.01)

(52) U.S. Cl. .................................... 333/204; 333/246

(58) Field of Classification Search ................ 333/246, 333/116, 204, 134
See application file for complete search history.

(56) References Cited

U.S. PATENT DOCUMENTS

| | | | | |
|---|---|---|---|---|
| 4,140,917 A | | 2/1979 | Weiner .................... 307/106 |
| 4,701,727 A | | 10/1987 | Wong | |
| 4,821,007 A | * | 4/1989 | Fields et al. ............... 333/238 |
| 5,345,205 A | | 9/1994 | Kornrumpf ................ 333/246 |
| 5,359,304 A | | 10/1994 | Fujiki ....................... 333/116 |
| 5,438,697 A | | 8/1995 | Fowler et al. .............. 455/347 |
| 5,668,511 A | * | 9/1997 | Furutani et al. ............ 333/204 |
| 5,691,676 A | | 11/1997 | Snel et al. ................. 333/204 |
| 5,825,264 A | | 10/1998 | Yamakazi et al. .......... 333/204 |
| 5,929,510 A | | 7/1999 | Geller et al. ............... 257/635 |
| 5,929,729 A | | 7/1999 | Swarup ..................... 333/246 |
| 5,963,115 A | | 10/1999 | Holleboom et al. ........ 333/204 |
| 6,147,571 A | * | 11/2000 | Kitazawa et al. ........... 333/126 |
| 6,170,154 B1 | | 1/2001 | Swarup ...................... 29/830 |
| 6,178,339 B1 | * | 1/2001 | Sakai et al. ................ 505/210 |
| 6,191,666 B1 | | 2/2001 | Sheen ....................... 333/185 |
| 6,208,220 B1 | | 3/2001 | Logothetis ................ 333/116 |
| 6,333,856 B1 | | 12/2001 | Harju ....................... 361/761 |
| 6,429,112 B1 | | 8/2002 | Smith et al. ............... 438/611 |
| 6,525,623 B2 | | 2/2003 | Sridharan et al. ........... 333/128 |
| 6,635,958 B2 | | 10/2003 | Bates et al. ................ 257/703 |
| 6,734,750 B1 | * | 5/2004 | Ostergaard .................. 333/1 |
| 6,765,455 B1 | * | 7/2004 | De Lillo et al. ............ 333/116 |
| 6,788,164 B2 | * | 9/2004 | Maekawa et al. ............ 333/26 |
| 6,798,317 B2 | | 9/2004 | Silk et al. .................. 333/185 |

(Continued)

FOREIGN PATENT DOCUMENTS

EP 0626099 11/1994

(Continued)

*Primary Examiner*—Benny Lee
(74) *Attorney, Agent, or Firm*—GrayRobinson, P.A.

(57) ABSTRACT

The present invention provides a method and apparatus for design of low loss, size restricted high frequency circuits. In a preferred embodiment, an electronic device includes: a first circuit layer located above the main circuit board comprising a first stripline passive circuit; and a second circuit layer located above the first circuit, the second layer comprising a second stripline circuit. The two stripline circuits can be separately coupled to leads, or coupled to each other and other leads using vias through the ground layer(s) separating each stripline. The stacked stripline elements can be used together with other circuits, and the stacked circuit board can be conveniently joined together with other assemblies, e.g., by surface mounting to a main board. The utility of this topology can be extended by the use of n-circuit embodiment or embedding in a multilayered main circuit board.

6 Claims, 3 Drawing Sheets

U.S. PATENT DOCUMENTS

| | | | |
|---|---|---|---|
| 6,856,007 B2 | 2/2005 | Warner | 257/678 |
| 6,917,265 B2 * | 7/2005 | Almeida et al. | 333/246 |
| 7,084,715 B2 | 8/2006 | Al-Taei et al. | |
| 2001/0001343 A1 | 5/2001 | Logothetis | 29/600 |
| 2004/0000701 A1 | 1/2004 | White et al. | 257/664 |
| 2004/0000979 A1 | 1/2004 | Puzella et al. | 333/246 |
| 2004/0183198 A1 | 9/2004 | Andrei et al. | 257/758 |
| 2004/0201085 A1 | 10/2004 | Ogawa et al. | 257/678 |
| 2004/0232523 A1 | 11/2004 | Shamsaifar et al. | 257/602 |
| 2004/0245617 A1 | 12/2004 | Damberg et al. | 257/686 |

FOREIGN PATENT DOCUMENTS

| | | |
|---|---|---|
| EP | 0 795 907 A1 | 9/1997 |
| EP | 0 858 251 A1 | 8/1998 |
| EP | 0 911 904 A2 | 4/1999 |
| EP | 0 924 969 A2 | 6/1999 |
| EP | 1237191 A2 | 9/2002 |
| JP | 5235619 | 9/1993 |
| WO | 93/16491 A1 | 8/1993 |
| WO | 00/77881 A1 | 12/2000 |
| WO | 2004/025699 | 3/2004 |

* cited by examiner

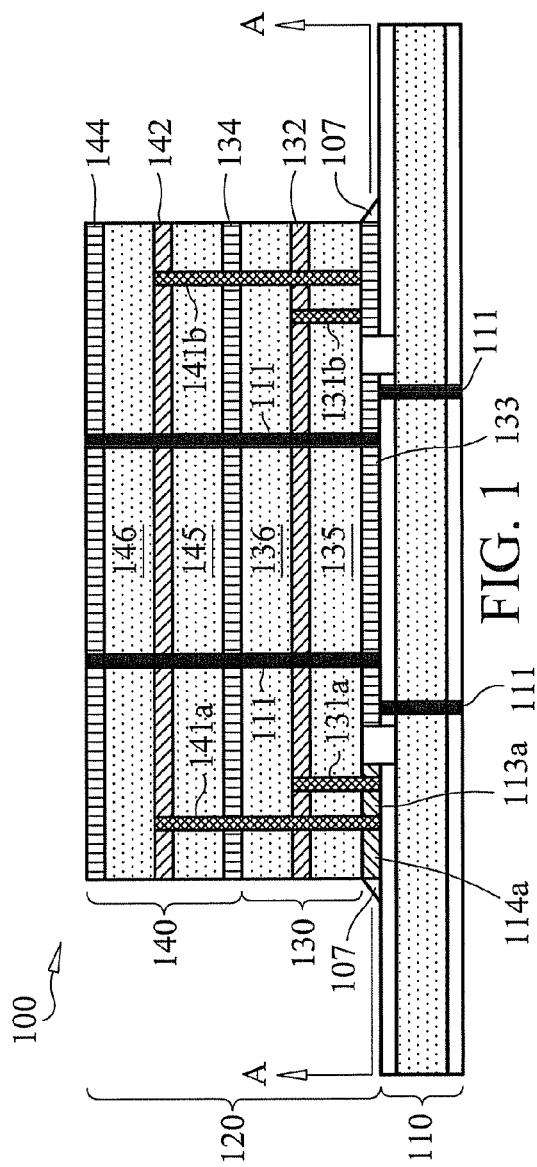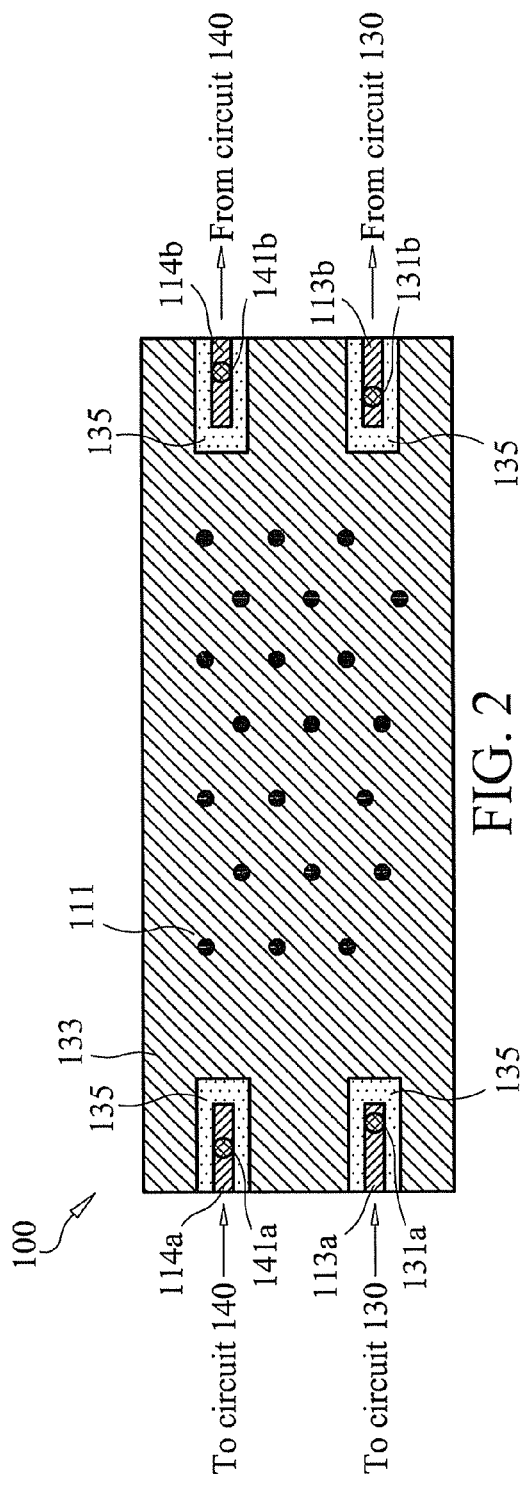

STACKED STRIPLINE CIRCUITS

FIELD OF THE INVENTION

The present invention is directed to radio frequency or microwave communications systems or subsystems that require integration of multiple passive circuits in limited spaces.

BACKGROUND OF THE INVENTION

Passive elements are used in all manner of electronic circuits. A wide variety of implementations are known for implementing passive circuits, including lumped element and distributed element designs. In certain applications microstrip and stripline designs have also been employed. For example, a stripline is a printed signal path disposed between two ground planes in a printed circuit board. Many single-element stripline circuits are known and used in the industry (e.g., as implemented by the Anaren Xinger couplers), and disclosures have been made about extending a single element stripline into two layers (see, e.g., U.S. Pat. No. 5,929,729 to Swarup (where coupling was an objective), and U.S. Pat. No. 5,359,304 to Fujiki.

In certain high frequency applications, prior approaches towards designing passive elements have proved unsatisfactory. For example, lumped-element harmonic filters tend to result in poor manufacturing yield, and board-to-board performance variation is typical, requiring expensive hand-tuning. On the other hand, distributed element designs are not typically used where there is limited board space and the possibility of re-entrant bands (e.g., passbands repeated at harmonic frequency, to suppress out-of-band rejection). If the application has to be low loss, the design constraints become even more difficult. For example, where the radio-frequency (RF) is above 1 GHz, many applications will require limiting the radiation of unintended signals (spurs, harmonics, etc) to maximize frequency spectrum reutilization. Such requirements drive the need for passive circuits like low pass filters that provide the lowest possible insertion loss and maximum out-of-band rejection. The conventional lumped-element elliptic low pass filters are very difficult to implement at frequencies above 1 GHz due to small component values and extreme sensitivity to component tolerance. Stripline circuits would not be considered by a typical designer, since the physical dimensions of distributed elements at frequencies below 2 GHz are prohibitively large. This rules out the use of distributed element filters when more than one filter has to be implemented in a constrained board space.

There remains, therefore, a need for a better approach to circuit design for multiple high frequency (i.e., greater than 1 GHz), low loss passive elements for use in constrained-size applications. Just such an approach is now possible by the invention described in more detail in connection with the following embodiment.

SUMMARY OF THE INVENTION

The present invention provides such a method and apparatus for design of low loss, size restricted high frequency circuits. In a preferred 2-circuit embodiment, an electronic device includes: a first circuit layer comprising a first stripline passive circuit located between a top and a bottom ground layer; and a second circuit layer located above the first circuit, the second layer comprising a second stripline circuit between a top and a bottom ground layer; the bottom ground layer is shared with the first circuit. The two stripline circuits can be separately coupled to leads, or coupled to each other and other leads using vias through the ground layer(s) separating each stripline. The stacked stripline elements can be used together with other circuits, and the stacked circuit board can be conveniently joined together with other assemblies, e.g., by surface mounting to a main board. An N-circuit implementation extends this 2-circuit embodiment over more circuit layers.

BRIEF DESCRIPTION OF THE DRAWINGS

While the invention is defined by the appended claims, as an aid to understanding it, together with certain of its objectives and advantages, the following detailed description and drawings are provided of an illustrative, presently preferred embodiment thereof, of which:

FIG. 1 is a cross-sectional illustration of a 2-circuit implementation of a stacked stripline circuit electronic device according to first embodiment of the present invention shown mounted to a main circuit board.

FIG. 2 is a bottom view of the embodiment of FIG. 1 as viewed from plane A-A.

DESCRIPTION OF THE PREFERRED EMBODIMENT

Figure 3:
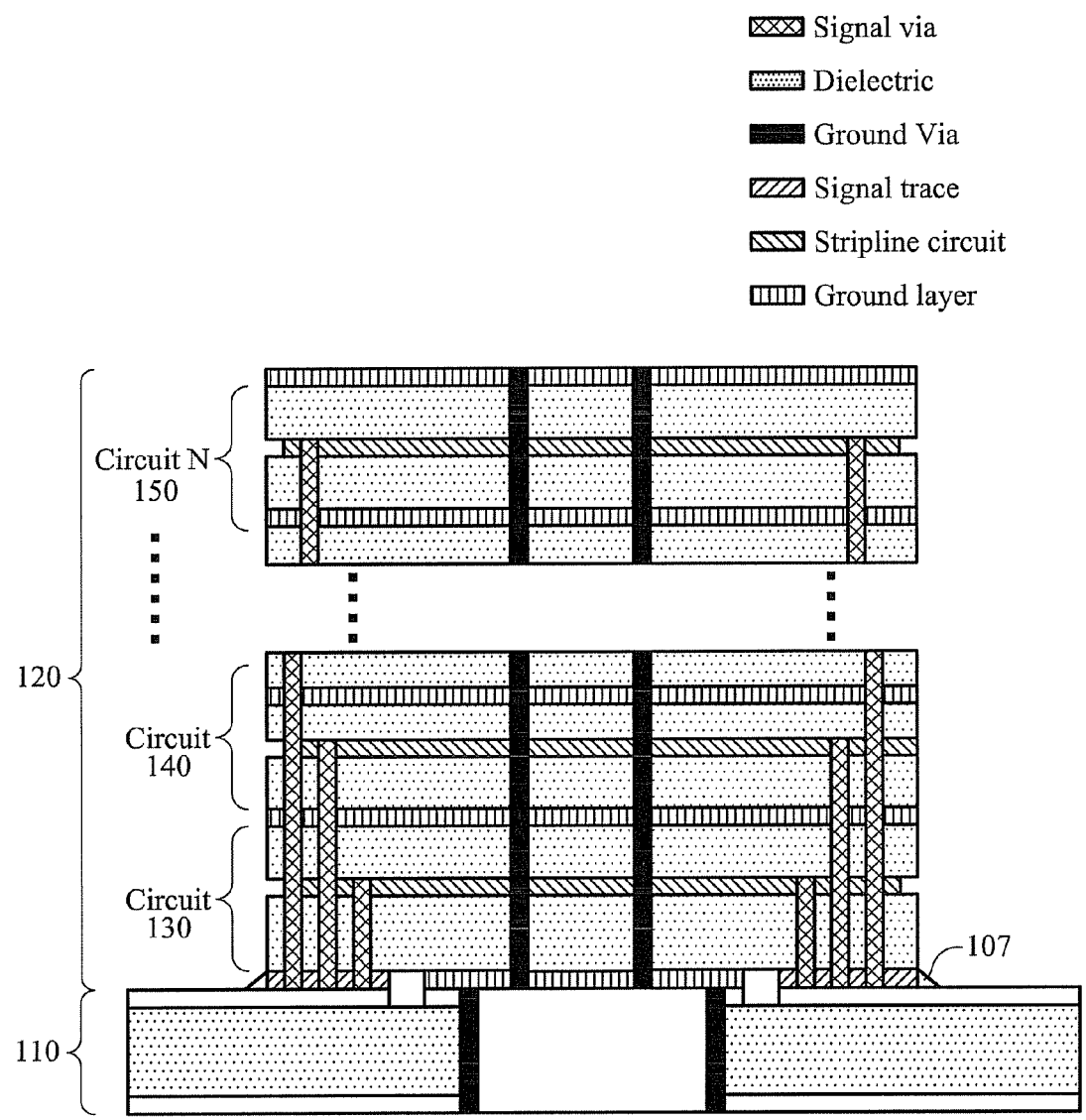
FIG. 3 is an illustration of an N-circuit stacked stripline implementation of multiple stripline circuits integrated into a single package.

In a preferred embodiment of the invention, a system is provided for high frequency passive elements, where plural passive elements are formed in stripline topology stacked vertically in relation to each other. This arrangement permits implementation of multiple high frequency, low loss circuits in a small footprint.

FIG. 1, and FIG. 2 together illustrate a two-layer stacked stripline circuit package 100 for use according to a first embodiment of the invention. The circuit package 100 includes a main circuit board 110 to which is mounted a stacked stripline circuit assembly 120 as shown in FIG. 1. In this embodiment, assembly 120 includes a pair of layers; a first circuit layer 130 and a second circuit layer 140. Each circuit layer 130, 140 includes a respective stripline circuit 132, 142 for performing a unique function such as filtering a signal.

As FIG. 1 shows, first circuit layer 130 is preferably a first stripline circuit 132 sandwiched between ground planes 133 and 134. The stripline circuit 132 is isolated from the ground planes 133 and 134 by dielectric substrates 135 and 136, respectively. The first stripline circuit 132 is connected to the circuit on the main board 110 by signal via lines 131a and 131b. Signal via line 131a is connected to a signal trace 113a disposed on dielectric layer 135 adjacent ground layer 133 as shown in FIGS. 1 and 2 to serve as a signal launch point for carrying signals to first stripline circuit layer 130. Signal via line 131b connects first stripline circuit 132 to a signal trace 113b (FIG. 2) disposed on dielectric layer 135 adjacent ground layer 133 to carry signals from first stripline circuit layer 130 to a signal trace 113b. Similarly, the second circuit layer 140 comprises a second stripline circuit 142 sandwiched between dielectric substrate layers 145 and 146, and ground layers 134 and 144. The second stripline circuit 142 of second circuit layer 140 is connected to a signal trace on the main board 110 by via connections 141a and 141b [(See FIG.

2)]. Signal via line 141*a* is connected to a signal trace 114*a* disposed on dielectric layer 135 adjacent ground layer 133 as shown in FIGS. 1 and 2 to serve as a signal launch point for carrying signals to second stripline circuit layer 140. Signal via line 141*b* connects second stripline circuit 142 to signal trace 114*b* (See FIG. 2) disposed on dielectric layer 135 adjacent ground layer 133 as shown in FIGS. 1 and 2 to serve as a signal launch point for carrying signals to second stripline circuit layer 140. Ground plane 133 is connected to the main board 110 by solder connections 107 as shown in FIG. 1. As FIGS. 1 and 2 show, ground planes 133, 134 and 144 are connected to one another by ground vias 111. Main circuit board 110 also has ground vias 111 as shown. The stripline topology provides power handling capability better than microstrip and built-in shielding.

FIG. 2 shows a bottom view of the stacked stripline assembly 120 (looking up from the main board 110, i.e., as indicted by line A-A in FIG. 1). This view shows the locations of the via connections 111, 131 and 141 in the interior of the element 133.

In a 2-circuit embodiment of a stacked stripline circuit assembly 120 in accordance with the invention we implement two elliptic low pass filters in stripline structure in a single package, again with one filter "stacked" on top of the other. In this embodiment, stripline circuit layer 130 comprises the first elliptic low pass filter and stripline circuit layer 140 comprises the second elliptic low pass filter, each having different cut-off frequency.

By implementing two distributed-element filters as stacked stripline circuit layers 130 and 140, respectively, it is possible to have both filters in the space normally required for one filter. The ground plane 134 between the two filters, an integral part of stripline circuit assembly 120, provides isolation between the two filters formed by stripline circuit layers 130 and 140. This also eliminates the need to provide external shielding which would add additional parts to the end-assembly. In addition, the use of a distributed element filter allows for more repeatable performance compared to lumped-element filters.

The distributed element filters formed by stripline circuit layers 130 and 140 are synthesized from the lumped-element circuit model using available filter element value tables. To optimize the performance of the filters, electromagnetic simulation is used to tune the dimensions of prototype filters. The filter using multiple cascaded hairpin resonators provides a very sharp cutoff frequency response with low insertion loss. Furthermore, to increase the rejection-band bandwidth, additional attenuation poles are added to the filter. The filters are evaluated by building a few prototypes and ascertaining that the measurement is in agreement with the simulation. This embodiment realizes a wide stop-band analogous to the ideal lumped element version. The measurement shows that the second filter (on circuit layer 130) had typically 30 dB up to 14 GHz and 25 dB out-of-band rejections up to 18 GHz. The cut-off frequency of the second filter is 2 GHz. The circuit can be designed as a separate board that can be surface-mounted to the main board 110.

This embodiment may be used to replace two different elliptic low pass filters used in an RF (radio frequency) transmitter, particularly where very limited board space is available. The lumped-element version may comprise twenty (20) different inductors and capacitors. The performances of the lumped-element version could vary substantially due to component value tolerances. Tin shields might also be required to mitigate the performance degradation caused by coupling between elements and the two filters. One integrated component in accordance with the above embodiment with dual function; may thus replace twenty (20) pick-and-place components with one and eliminate the need for separate RF shielding.

Figure 4:
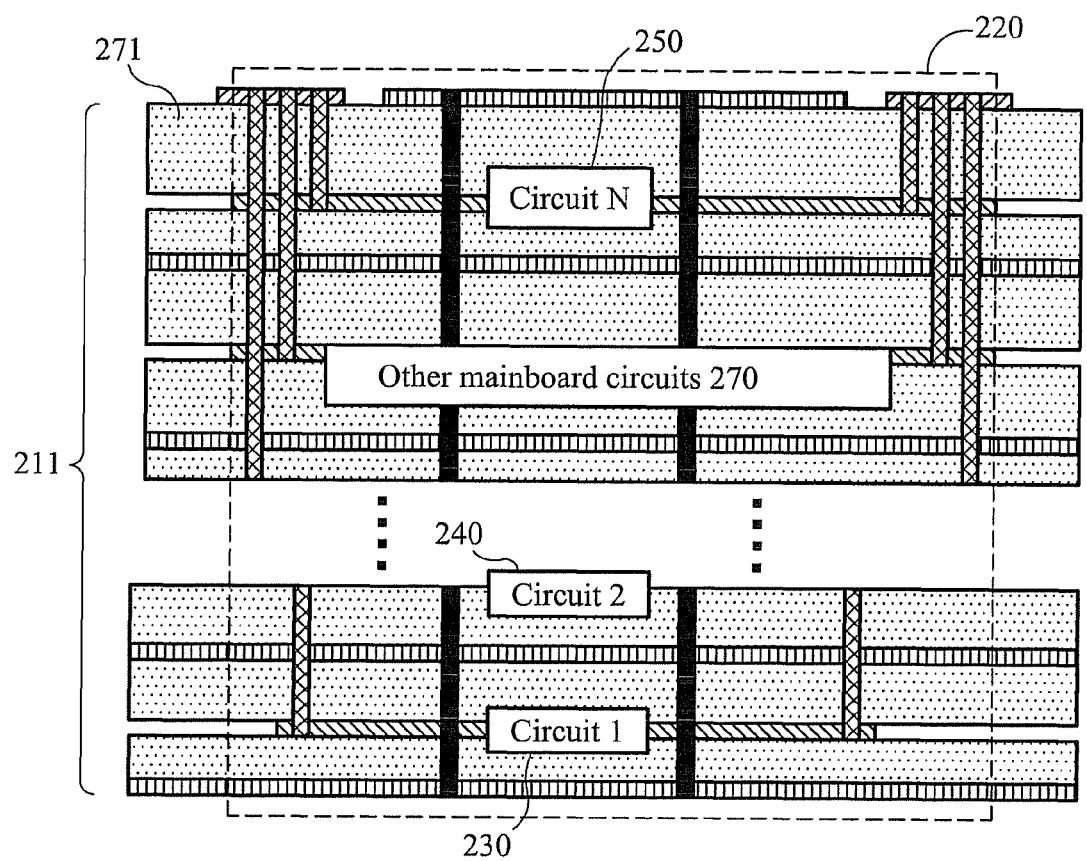
FIG. 4 is an illustration of an alternate implementation of the present invention where a stacked stripline circuit is an integral part of a main circuit board which has multiple layers.

The utility of this embodiment is not limited to two circuits or filters. More than two passive circuits realizable in stripline structure can be integrated in a single package, such as shown in FIG. 3. FIG. 3 shows a cross sectional view of an N-layer implementation wherein a stacked stripline circuit assembly 120 is attached to the main board 110 with a solder connection 107. As an example, additional filters 150 can be added to the 2-circuit embodiment by simply stacking more filters. As FIG. 3 shows, N-layer assembly 120 includes a first circuit layer, namely circuit 130 connected to the main board 110 and shows a second circuit layer, namely circuit 140 stacked above circuit 130. As indicated by the broken lines formed by a series of stacked boxes in FIG. 3, this N-layer stripline circuit assembly 120 further comprises one or more stripline circuits stacked successively atop one another, the topmost layer of N-layer assembly 120 is referred to as "Circuit N" which is designated in FIG. 3 by reference numeral 150. Other passive circuits such as couplers, power splitters, or delay lines can be implemented in one of the layers. Some active circuits can also be implemented, such as phase shifters, attenuators, and switches, etc. The active elements can be installed in pockets in the inner layers or, preferably, on the top layer with via connection to other layers. These can be implemented as a single integrated circuit (IC), or part of a series of smaller ICs, (e.g., subsequently surface mounted or otherwise joined to a main board of a component or electronics device). Further, it may also be implemented as part of a multilayer circuit board, such as illustrated by FIG. 4. This embodiment may be used when the circuit implemented in FIG. 1, 2 or 3 will not require subsequent changes. By doing so, a soldering step can be eliminated and an extra main circuit board space can be freed for use by other circuits.

FIG. 4 shows an embedded implementation of an N-layer stacked stripline circuit as part of an N-layer board 211. An embedded stacked stripline circuit 220 comprises a first circuit 230 (Circuit 1), a second circuit 240 (Circuit 2), up to an Nth circuit 250 (Circuit N) with a top layer 271. Other main board circuits 270 are spread among the layers.

Of course, one skilled in the art will appreciate how a variety of alternatives are possible for the individual elements, and their arrangement, described above, while still falling within the scope of the invention. Thus, while it is important to note that the present invention has been described in the context of an implementation for plural stripline filters, those of ordinary skill in the art will appreciate that the present invention applies equally regardless of the particular type of passive element actually used in implementing the desired circuit. Further, while this has been found particularly useful for circuits in the 1-2 GHz range, and more generally in the 1-4 GHz range, it should have equal application to all high frequency (i.e., greater or equal to 1 GHz) integrated circuits depending on the desired application and other design considerations.

In conclusion, the above description has been presented for purposes of illustration and description of an embodiment of the invention, but is not intended to be exhaustive or limited to the form disclosed. This embodiment was chosen and described in order to explain the principles of the invention, show its practical application, and to enable those of ordinary skill in the art to understand how to make and use the invention. Many modifications and variations will be apparent to those of ordinary skill in the art. Thus, it should be understood that the invention is not limited to the embodiments described above, but should be interpreted within the full spirit and scope of the appended claims.

We claim:

1. An electronic device, comprising:
   (a) a first stripline circuit layer having a first stripline circuit disposed between a first ground layer and a second ground layer, said first stripline circuit layer further having a first dielectric layer disposed between said first ground layer and said first stripline circuit to isolate said first stripline circuit from said first ground layer, said first stripline circuit layer further having a second dielectric layer disposed between said first stripline circuit layer and said second ground layer to isolate said first stripline circuit layer from said second ground layer;
   (b) a second stripline circuit layer stacked directly on said first stripline layer, said second stripline circuit layer having a second stripline circuit disposed between said second ground layer and a third ground layer, said second stripline circuit layer further having a third dielectric layer disposed between said second stripline circuit and said second ground layer to isolate said second stripline circuit from said second ground layer, said second stripline circuit layer further having a fourth dielectric layer disposed between said second stripline circuit and said third ground layer to isolate said second stripline circuit from said third ground layer, said second ground layer being disposed between said first stripline circuit and said second stripline circuit to provide shielding between said first stripline circuit layer and said second stripline circuit layer;
   (c) a first signal trace disposed on said first dielectric layer adjacent said first ground layer,
   (d) a first via passing interiorly through said first dielectric layer and electrically coupling said first signal trace to said first stripline circuit;
   (e) a second signal trace disposed on said first dielectric layer adjacent said first ground layer,
   (f) a second via passing interiorly through said first dielectric layer, said second dielectric layer, said third dielectric layer, and said second ground layer, said second via electrically coupling said second signal trace to said second stripline circuit.

2. An electronic device as claimed in claim 1 further comprising at least one ground via passing interiorly through said first dielectric layer, and through said second dielectric layer and through said third dielectric layer and through said fourth dielectric layer to electrically couple said first ground layer and said second ground layer and said third ground layer to one another.

3. A method for making an electronic device, said method comprising the steps of:
   a. forming a first stripline circuit layer having a first stripline circuit disposed between a first ground layer and a second ground layer, said first stripline circuit layer further having a first dielectric layer disposed between said first ground layer and said first stripline circuit to isolate said first stripline circuit from said first ground layer, said first stripline circuit layer further having a second dielectric layer disposed between said first stripline circuit layer and said second ground layer to isolate said first stripline circuit layer from said second ground layer;
   b. forming a second stripline circuit layer stacked directly on said first stripline layer, said second stripline circuit layer having a second stripline circuit disposed between said second ground layer and a third ground layer, said second stripline circuit layer further having a third dielectric layer disposed between said second stripline circuit and said second ground layer to isolate said second stripline circuit from said second ground layer, said second stripline circuit layer further having a fourth dielectric layer disposed between said second stripline circuit and said third ground layer to isolate said second stripline circuit from said third ground layer, said second ground layer being disposed between said first stripline circuit and said second stripline circuit so as to form part of both said first stripline circuit layer and said second stripline circuit layer and to provide shielding between said first stripline circuit layer and said second stripline circuit layer;
   c. coupling said first stripline circuit, by a first via, to a first signal launch point disposed on said first dielectric layer adjacent said first ground layer; and
   d. coupling said second stripline circuit, by a second via, to a second signal launch point disposed on said first dielectric layer adjacent said first ground layer,
   wherein at least one of said first and second stripline circuits operates as an elliptical filter having multiple cascaded hairpin resonators with plural attenuation poles.

4. An electronic assembly comprising:
   (a) a main board having a plurality of internal layers and a plurality of main board circuits disposed among said internal layers of said main board, and
   (b) an electronic device physically embedded inside said main board, said electronic device having:
      (i) a first ground layer, a second ground layer, and a third ground layer, said first ground layer, said second ground layer, and said third ground layer being disposed in mutually stacked relation to one another; (ii) a first stripline circuit disposed between a first dielectric layer and a second dielectric layer, said first dielectric layer being located between said first stripline circuit and said first ground layer to isolate said first stripline circuit from said first ground layer, said second dielectric layer being located between said first stripline circuit and said second ground layer to isolate said first stripline circuit from said second ground layer;
      (iii) a second stripline circuit disposed between a third dielectric layer and a fourth dielectric layer, said third dielectric layer being located between said second stripline circuit and said second ground layer to isolate said second stripline circuit from said second ground layer, said fourth dielectric layer being located between said second stripline circuit and said third ground layer to isolate said second stripline circuit from said third ground layer, said second ground layer being disposed between said first stripline circuit and said second stripline circuit to provide shielding between said first stripline circuit and said second stripline circuit;
      (iv) a first signal via passing interiorly through at least one of said dielectric layers and through at least one of said ground layers, and through at least a portion of at least one of said internal layers of said main board to electrically couple said first stripline circuit to at least one of said main board circuits by way of said first signal via;
      (v) a second signal via passing interiorly through at least one of said dielectric layers, and through at least one of said ground layers and through at least a portion of at least one of said internal layers of said main board to electrically couple said second stripline circuit to at least one said main board circuits by way of said second signal via, and (vi) at least one ground via passing interiorly through said first dielectric layer, and through said second dielectric layer and through said third dielectric layer and through said fourth dielectric layer to electrically couple said first ground layer and said second ground layer and said third ground layer to one another.

5. A method for making an electronic device, said method comprising the steps of:
   a. forming a first stripline circuit layer having a first stripline circuit disposed between a first ground layer and a second ground layer, said first stripline circuit layer further having a first dielectric layer disposed between said first ground layer and said first stripline circuit to isolate said first stripline circuit from said first ground layer, said first stripline circuit layer further having a second dielectric layer disposed between said first stripline circuit layer and said second ground layer to isolate said first stripline circuit layer from said second ground layer;
   b. forming a second stripline circuit layer stacked directly on said first stripline layer, said second stripline circuit layer having a second stripline circuit disposed between said second ground layer and a third ground layer, said second stripline circuit layer further having a third dielectric layer disposed between said second stripline circuit and said second ground layer to isolate said second stripline circuit from said second ground layer, said second stripline circuit layer further having a fourth dielectric layer disposed between said second stripline circuit and said third ground layer to isolate said second stripline circuit from said third ground layer, said second ground layer being disposed between said first stripline circuit and said second stripline circuit to provide shielding between said first stripline circuit layer and said second stripline circuit layer;
   c. coupling said first stripline circuit, by a first via, to a first signal launch point disposed on said first dielectric layer adjacent said first ground layer; and
   d. coupling said second stripline circuit, by a second via, to a second signal launch point disposed on said first dielectric layer adjacent said first ground layer.

6. An electronic assembly comprising:
(a) a main board having a main board circuit, and
(b) an electronic device affixed to an exterior surface of said main board and electrically coupled to said main board circuit, said electronic device having:

(i) a first ground layer, a second ground layer, and a third ground layer, said first ground layer, said second ground layer and said third ground layer being disposed in mutually stacked relation to one another, said first ground layer being surface mounted to said exterior surface of said main board to affix said electronic device to said main board;

(ii) a first stripline circuit disposed between a first dielectric layer and a second dielectric layer, said first dielectric layer being located between said first stripline circuit and said first ground layer to isolate said first stripline circuit from said first ground layer, said second dielectric layer being located between said first stripline circuit and said second ground layer to isolate said first stripline circuit from said second ground layer;

(iii) a second stripline circuit disposed between a third dielectric layer and a fourth dielectric layer, said third dielectric layer being located between said second stripline circuit and said second ground layer to isolate said second stripline circuit from said second ground layer, said fourth dielectric layer being located between said second stripline circuit and said third ground layer to isolate said second stripline circuit from said third ground layer, said second ground layer being disposed between said first stripline circuit and said second stripline circuit to provide shielding between said first stripline circuit and said second stripline circuit;

(iv) a first signal trace disposed on said first dielectric layer adjacent said first ground layer, (v) a first signal via passing interiorly through said first dielectric layer to electrically couple said first stripline circuit to said first signal trace, said first stripline circuit of said electronic device being electrically coupled to said main board circuit by way of said first signal trace and said first signal via;

(vi) a second signal trace disposed on said second dielectric layer adjacent said first ground layer, and (vii) a second signal via passing interiorly through said first dielectric layer, and through said second dielectric layer and through said third dielectric layer to electrically couple said second signal trace to said second stripline circuit, said second stripline circuit of said electronic device being electrically coupled to said main board circuit by way of said second signal trace and said second signal via.

* * * * *